United States Patent [19]
Moriyama

[11] Patent Number: 5,388,029
[45] Date of Patent: Feb. 7, 1995

[54] SEMICONDUCTOR CHIP CARRIER CAPABLE OF STABLY MOUNTING A SEMICONDUCTOR CHIP

[75] Inventor: Yoshifumi Moriyama, Tokyo, Japan

[73] Assignee: NEC Corporation, Tokyo, Japan

[21] Appl. No.: 974,402

[22] Filed: Nov. 12, 1992

[30] Foreign Application Priority Data

Nov. 12, 1991 [JP] Japan .................. 3-295376

[51] Int. Cl.⁶ .................. H05K 7/02; H01R 9/00; H01L 23/02
[52] U.S. Cl. .................. 361/760; 361/772; 361/774; 361/765; 174/52.4; 257/690; 257/692
[58] Field of Search ........ 361/400, 397, 399, 401–404, 361/405, 406, 394; 174/52.1, 52.2, 52.3, 52.4; 257/678, 684, 687, 688, 690, 692, 693, 695, 696, 704, 787

[56] References Cited

U.S. PATENT DOCUMENTS 4,725,692  2/1988  Ishii et al. .................. 174/52.4

FOREIGN PATENT DOCUMENTS 0265367  4/1988  European Pat. Off. .
5929444  2/1984  Japan .
2138210  10/1984  United Kingdom .

OTHER PUBLICATIONS

IBM Technical Disclosure Bulletin, Bakos et al., vol. 21, No. 9 (Feb. 1979).
IBM Technical Disclosure Bulletin, vol. 29, No. 6 (Nov. 1986).
Research Disclosure, No. 318, Oct. 1990 "Progressive Lead Width From Chip Center to Provide Lead Strength", Emsworth.

*Primary Examiner*—Bot Ledynh

[57] ABSTRACT

In a semiconductor chip carrier which has a rectangular insulating substrate having four corners and electrode leads deposited on a peripheral surface of the substrate and which is mounted onto a circuit board with each electrode lead being connected to the corresponding board electrode through a solder mass, widths of the electrode leads are wider at each of the four corners than those of the electrode leads located at positions except the four corners. An area of the contact through the solder between each electrode lead positioned at each corner and the corresponding board electrode is wider than that between each of the other electrode lead and each corresponding board electrode. As each electrode lead positioned at each corner is strongly connected to the board electrode, it is seldom peeled off from the board electrode even when the circuit board is twisted or warped during or after the process of mounting the chip carrier onto the circuit board.

13 Claims, 4 Drawing Sheets

SEMICONDUCTOR CHIP CARRIER CAPABLE OF STABLY MOUNTING A SEMICONDUCTOR CHIP

BACKGROUND OF THE INVENTION

The present invention relates to a semiconductor chip carrier for use in supporting a semiconductor chip, and to a semiconductor device and an apparatus which includes the semiconductor chip carrier and the semiconductor device, respectively.

A semiconductor chip carrier has been used in the field of semiconductor assembly technique. In such a field, a chip carrier of plastic. LCC (Leadless Chip Carrier) type has recently attracted considerable attention as a chip carrier which is applicable to a high density assembly in a circuit board, because it makes it possible to become as thin as substantially 1 mm.

A conventional LCC type chip carrier, as will later be described in detail, comprises an insulating substrate which has a rectangular shape having four corners and which has a central surface and a peripheral surface surrounding the central surface, and a plurality of electrode leads deposited on the peripheral surface. On such a chip carrier, a semiconductor chip is mounted on the central surface of the insulating substrate to form a semiconductor device. After completion of the semiconductor device, the insulating substrate is further mounted on a circuit board which has a plurality of board electrodes on a board surface. The board electrodes are electrically connected to the electrode leads on the chip carrier by the use of solder. Thus, the chip carrier is mounted on the circuit board.

In the meantime, necessity of the aforesaid high density assembly requires to make each electrode lead fine. Consequently, each electrode lead should be connected to each board electrode through a very small contact area. As a result, strength of connection between the solder and each electrode lead becomes weak with a decrease of the area between the solder end each electrode lead. For example, provided that the strength of connection by the solder is 500 g/mm$^2$, the strength of 60 g per one electrode lead is acquired when the area of contact of the solder per one electrode lead is as small as 0.12 mm$^2$ (0.3×0.4 mm$^2$). If the number of electrode leads is between 50 and 80, the strength of connecting the package to the circuit board, as a whole, merely falls within a range between 3 kg and 5 kg. Thus, the strength of the whole connection is not so small.

However, a stress sometimes acts on the circuit board during or after an assembly process. The circuit board is sometimes twisted or warped as a result of the stress. Since the stress is concentrated on each electrode lead positioned at each of the four corners of the rectangular insulating substrate of the chip carrier, the electrode leads positioned thereat often come off the board electrodes by such a twist or warp of the circuit board. Thus, it often happens that the electrode leads are peeled off from the board electrodes at the four corners of the insulating substrate. Specifically, when the chip carrier is mounted on the circuit board which is known as a thin-type circuit board for a high density assembly and which has a thickness thinner than 0.6 mm, such a circuit board is apt to be easily twisted or warped during or after the assembly process. Therefore, the problem that the electrode leads come off the board electrodes is very serious in such a thin-type circuit board.

SUMMARY OF THE INVENTION

It is an object of this invention to provide a semiconductor chip carrier which is strongly connected to a circuit board.

It is another object of this invention to provide a semiconductor chip carrier of which electrode leads are firmly connected to board electrodes to prevent the electrode leads and the board electrodes from being peeled off.

According to this invention, an improved semiconductor chip carrier which is for use in supporting a semiconductor chip is provided. It comprises an insulating substrate which has a substantially rectangular shape having four corners and which has a central portion having a primary surface and a peripheral portion having a secondary surface surrounding the primary surface, and electrode leads deposited on the secondary surface; wherein the electrode leads comprises: first electrode leads positioned remote from the four corners and each of which has a first predetermined width; and second electrode leads each of which is adjacent to each of the corners in comparison with the first electrode leads and each of which has a second width wider than the first width.

The second electrode leads may be equal in number to four; each second electrode lead being located on each four corner.

The second electrode leads may also be equal in number to eight; the eight second electrode leads being located on both sides of each of the four corners with each corner interposed therebetween.

DESCRIPTION OF THE PREFERRED EMBODIMENT

Figure 1A:
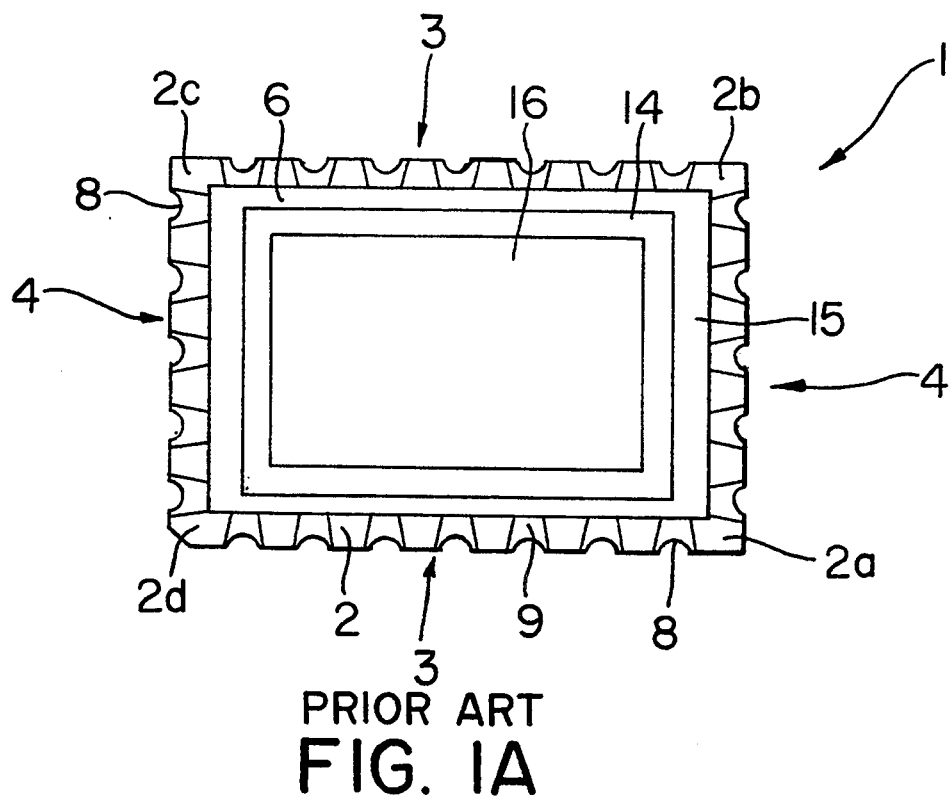
FIG. 1(A) is a plan view for use in describing a conventional semiconductor chip carrier.

Referring to FIGS. 1(A) and (B), a conventional semiconductor chip carrier will first be described for a better understanding of this invention.

Figure 1B:
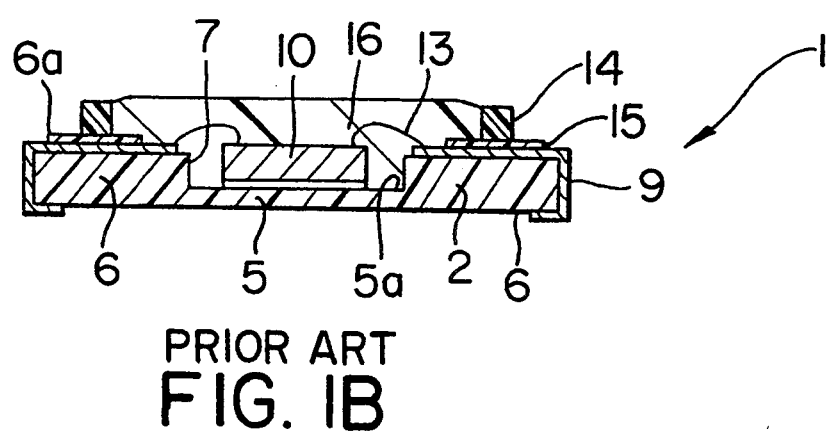
FIG. 1(B) is a sectional view for use in describing the semiconductor chip carrier illustrated in FIG. 1(A)

In FIGS. 1(A) and 1(B), illustration is made about a semiconductor chip carrier 1 which is a plastic LCC type one. The semiconductor chip carrier 1 comprises an insulating substrate 2 which is made of a glass epoxy resin plate. In FIG. 1(A), a predetermined direction may be defined from the lefthand side of FIG. 1 to the righthand side thereof on the insulating substrate 2 for brevity of description. Taking this into account, the insulating substrate 2 also has two sides 3, 3 which are parallel to the predetermined direction and the other two sides 4, 4 which are orthogonal to the predetermined direction. Formed by the sides 3, 3 and 4, 4, the insulating substrate 2 has a substantially rectangular shape which has four corners 2a, 2b, 2c, and 2d. The insulating substrate 2 also has a central portion 5 having a primary surface 5a and a peripheral portion 6 having a secondary surface 6a which surrounds the primary surface 5a. The primary surface 5a is offset from the secondary surface 6a to form a recess 7 in which a semiconductor chip is mounted. The peripheral portion 6 has a plurality of grooves 8 which are aligned at equal spaces in each side surface of the peripheral portion 6. On the secondary surface 6a of the peripheral portion 6, a plurality of electrode leads 9 are deposited such that each electrode lead 9 is perpendicular to each side of the insulating substrate 2 and that each electrode lead 9 is extended into each groove 8. Each of the electrode leads 9 has a predetermined or uniform width such as 0.3 mm.

Now, referring to FIGS. 2(A) and (B), description will be made as to an assembly process of a semiconductor apparatus, namely, a method of mounting a semiconductor chip to a circuit board through the chip carrier 1 illustrated in FIG. 1.

At first, description is made about a method of mounting a semiconductor chip 10 onto the chip carrier 1 to form a semiconductor device 11. The semiconductor chip 10 may have a circuit (not shown), such as selected one of an IC circuit, an LSI circuit, and a VLSI circuit and a plurality of chip electrodes 12 electrically connected to the circuit. As illustrated in FIGS. 2(A) and (B), the semiconductor chip 10 is mounted on the primary surface 5a formed by the recess 7. The chip electrodes 12 are then connected to the electrode leads 9 through first connection elements, such as bonding wires 13, 13. After these connections, a resin frame 14 rests on the portions of the electrode leads 9 which are positioned on the secondary surface 6a of the peripheral portion 6 through a layer 15 which protects the electrode leads 9 from the resin frame 14. The area surrounded by the resin frame 14 is then filled with resin 16 to cover the semiconductor chip 10 with the resin 16 airtightly. Thus, the semiconductor device 11 is manufactured by a combination of the chip carrier 1 and the semiconductor chip 10.

Figure 2A:
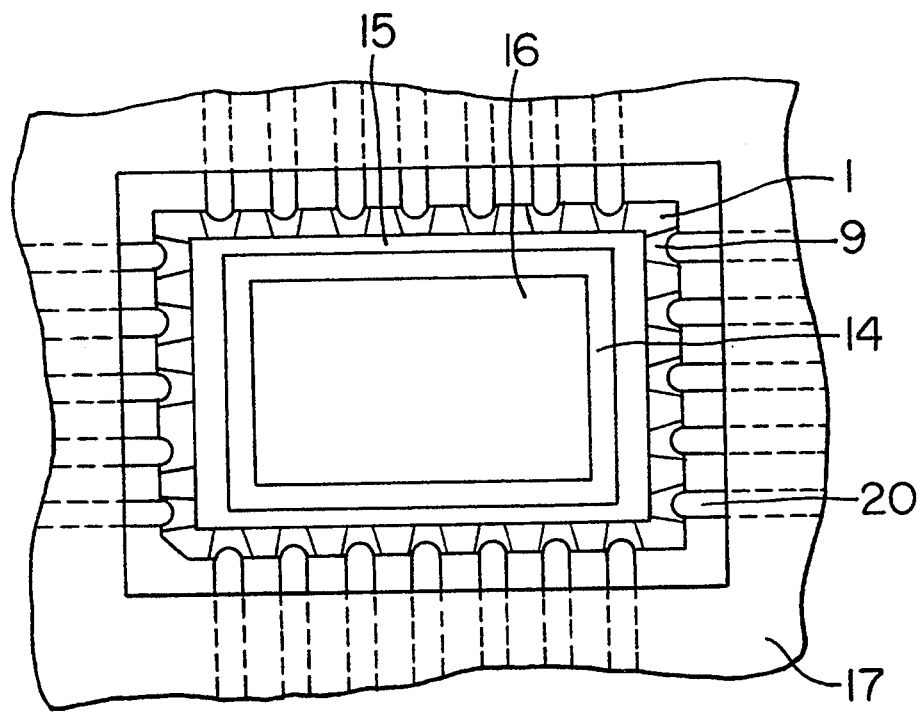
FIG. 2(A) is a plan view for use in describing the semiconductor chip carrier illustrated in FIG. 1(A), which is mounted on a circuit board.
Figure 2B:
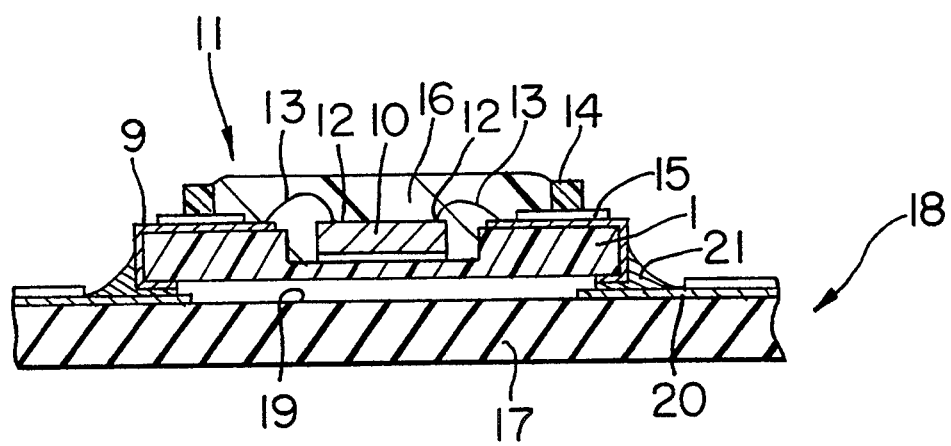
FIG. 2(B) is a sectional view for use in describing the semiconductor chip carrier illustrated in FIG. 2(A)

Second, description is made about a method of mounting the semiconductor device 11 onto a circuit board 17 to form a semiconductor apparatus 18, as illustrated in FIGS. 2(A) and (B). The circuit board 17 has a thickness which is not more than 0.6 mm, a board surface 19, and a plurality of board electrodes 20 deposited on the board surface 19. Solder paste regions, as second connection elements, are printed on the board electrodes 20. The chip carrier 1 is then mounted on the circuit board 17 with the electrode leads 9 electrically connected to the corresponding board electrodes 20. In this event, the electrode leads 9 are also connected to the board electrodes 20 through solder masses 21 which serves as second connection elements by a solder reflow method. Thus, the semiconductor apparatus 18 is formed by a combination of the semiconductor device 11 and the circuit board 17.

However, when a stress acts on the circuit board 17 during or after the assembly process of the semiconductor apparatus 18, the circuit board 17 is easily twisted or warped as a result of the stress. Since the stress is concentrated on each electrode lead 9 positioned at each of the four corners 2a, 2b, 2c, and 2d, the electrode leads 9 positioned thereat often come off the board electrodes 20 by such a twist or warp of the circuit board 17, as mentioned in the preamble of the instant specification.

Figure 3A:
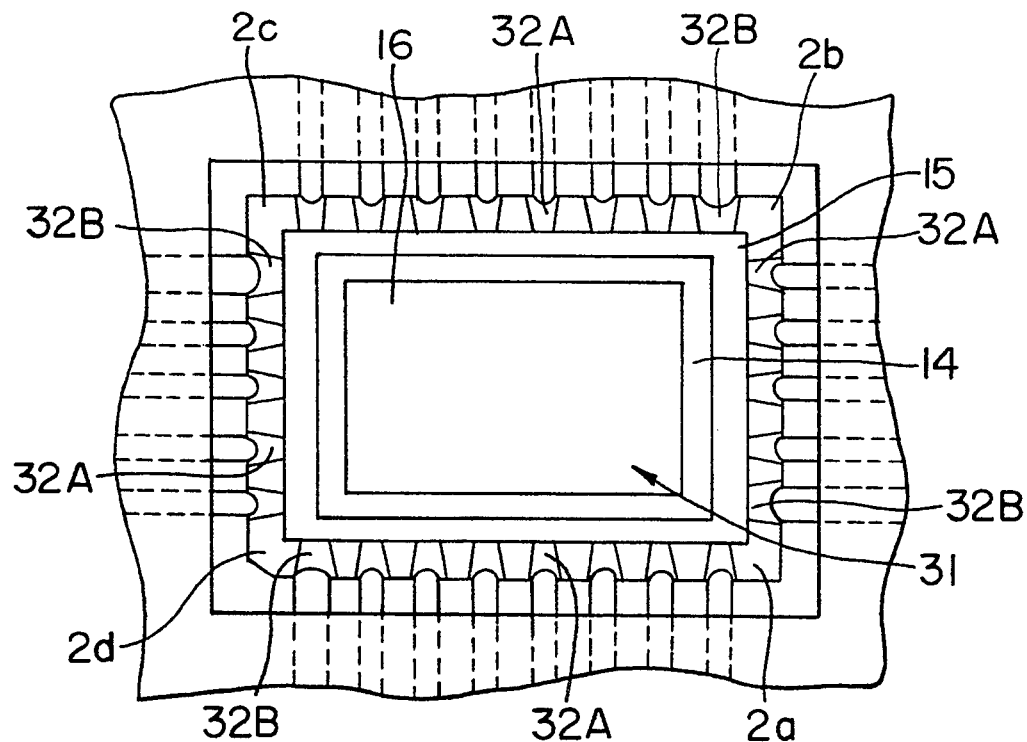
FIG. 3(A) is a plan view for use in describing a semiconductor chip carrier according to a first embodiment of this invention, which is mounted on a circuit board.
Figure 3B:
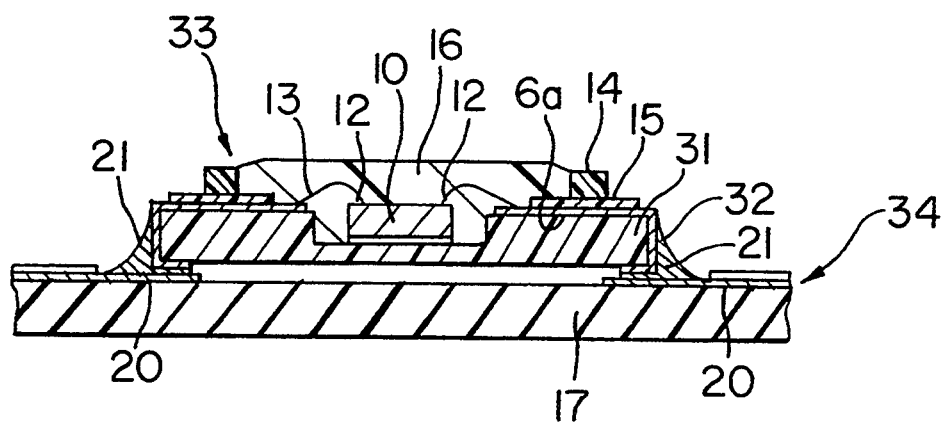
FIG. 3(B) is a sectional view for use in describing the semiconductor chip carrier illustrated in FIG. 3(A)

Referring to FIGS. 3(A) and (B), description will at first proceed to a semiconductor chip carrier according to a first embodiment of this invention. The illustrated semiconductor chip carrier, comprises some parts which are similar to those of the above-described conventional semiconductor chip carrier and which are represented by the common reference numerals.

Like in FIGS. 1(A) and (B), the semiconductor chip carrier 31 illustrated in FIGS. 3(A) and (B) also comprises the insulating substrate 2. On the secondary surface 6a of the peripheral portion 6 of the insulating substrate 2, a plurality of electrode leads 32 are deposited such that each electrode lead 32 is perpendicular to each side of the insulating substrate 2 and that each electrode lead 32 is extended into each groove 8.

The electrode leads 32 comprises first electrode leads 32A positioned remote from the four corners 2a, 2b, 2c, and 2d and second electrode leads 32B each of which is adjacent to each of the corners 2a, 2b, 2c, and 2d. The second electrode leads 32B are equal in number to four and are located at the four corners 2a, 2b, 2c, and 2d, respectively. Herein, each of the first electrode leads 32A has a first predetermined or uniform width. On the other hand, each of the second electrode leads 32B has a second width wider than the first predetermined or uniform width. Specifically, the second width is approximately 0.6 mm while the first width is approximately 0.3 mm, in the illustrated example. Besides, each of the first electrode leads and the second electrode leads has a predetermined length of about 0.4 mm.

Now, description will be made as to a process of assembling a semiconductor apparatus, namely, a method of mounting the semiconductor chip 10 to the circuit board 17 with the chip carrier 31 illustrated in FIGS. 3(A) and (B).

Like the conventional semiconductor chip carrier 1 illustrated in FIGS. 2(A) and (B), the semiconductor chip 10 is, at first, mounted to the chip carrier 31 to form a semiconductor device 33. After the chip electrodes 12 are connected to the electrode leads 32 through bonding wires 13, 13, a resin frame 14 rests on the portions of the electrode leads 32 which are positioned on the secondary surface 6a through the layer 15. The area surrounded by the resin frame 14 is then filled with the resin 16 to cover the semiconductor chip 10 with the resin 16 airtightly. Thus, the semiconductor device 33 is manufactured by a combination of the chip carrier 31 and the semiconductor chip 10.

Second, the semiconductor device 33 is mounted onto the circuit board 17 to form a semiconductor apparatus 34. After the solder paste regions are printed on the board electrodes 20, the chip carrier 31 is mounted on the circuit board 17 with the electrode leads 32 electrically connected to the corresponding board electrodes 20. In this event, the electrode leads 32 are also connected to the board electrodes 20 through the solder masses 21 by the solder reflow method. Thus, the semiconductor apparatus 34 is formed by a combination of the semiconductor device 33 and the circuit board 17.

When a stress acts on the circuit board 17 during or after the assembly process of the semiconductor apparatus 34, the circuit board 17 is easily twisted or warped as a result of the stress. In such a case, the stress is concentrated on each electrode lead 32 positioned at each of the four corners 2a, 2b, 2c, and 2d. However, each electrode lead 32B positioned thereat has the second width of approximately 0.6mm equal to twice the first width. Accordingly, the area of contact of the solder 21 per one electrode lead 32B is as wide as 0.24 mm² (0.6×0.4 mm²) while the area of contact of the solder 21 per one electrode lead 32A is as narrow as 0.12 mm² (0.3×0.4 mm). Each electrode lead 32B is therefore strongly connected to the corresponding board electrode 20. As a result, not only the electrode lead 32B but also the electrode leads 32A adjacent to the electrode lead 32B seldom come off the board electrodes 20 by such a twist or warp of the circuit board Consequently, strength of mechanical connection between the electrode leads 32 and the board electrodes 20 can be extremely improved in the illustrated example.

Figure 4:
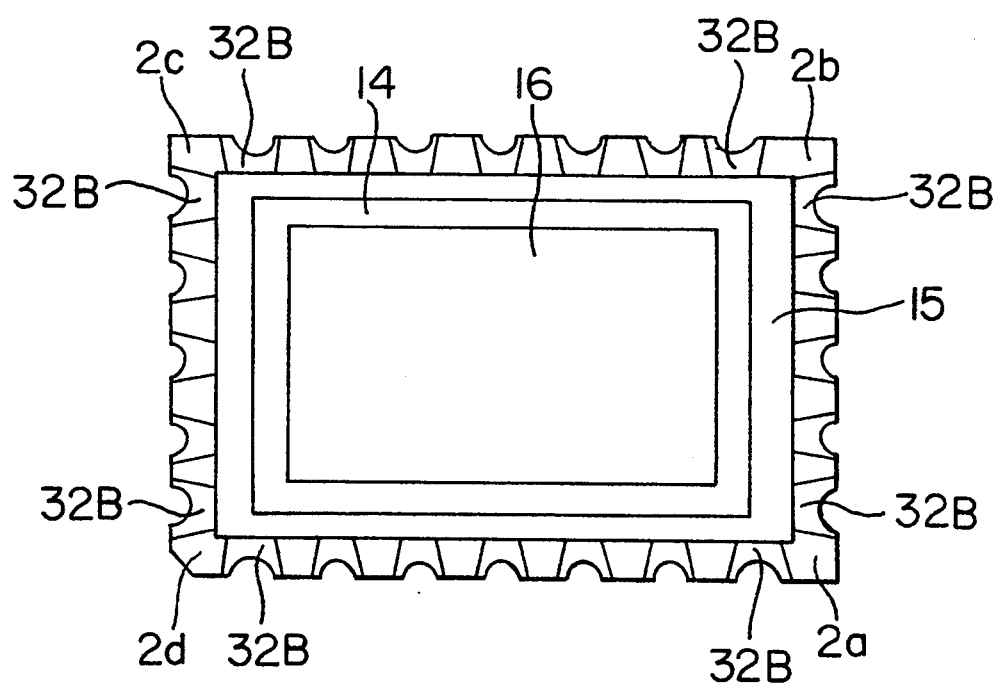
FIG. 4 is a plan view for use in describing a semiconductor chip carrier according to a second embodiment of this invention.

Referring to FIG. 4, a semiconductor chip carrier according to a second embodiment of this invention is similar in structure to that illustrated in FIGS. 3(A) and (B) except that the second electrode leads 32B are equal in number to eight. In this connection, a pair of the second electrode leads 32B is located on both sides of each of the four corners 2a, 2b, 2c, and 2d. As a result, each of the corners 2a, 2b, 2c, and 2d is interposed between each pair of the second electrode leads 32B.

With this embodiment, the electrode lead 32B of each pair has the second width of approximately 0.6 mm. Each pair of the electrode leads 32B is therefore strongly connected to the corresponding board electrode 20 (shown in FIGS. 3(A) and (B)). As a result, strength of connection between the electrode leads 32 and the board electrodes 20 becomes stronger than that in the aforesaid first embodiment of this invention.

While this invention has thus far been described in conjunction with only two embodiments thereof, it will readily be possible for those skilled in the art to put this invention into practice in various other manners. For example, the insulating substrate 2 may be made of a multilayer ceramic plate which is formed by a plurality of ceramic layers. On the other hand, the primary surface 5a may be flush with the secondary surface 6a. Moreover, number of the second electrode leads may not be restricted to four and eight.

What is claimed is:

1. A chip carrier for use in supporting a semiconductor chip and comprising:
    a leadless carrier portion formed of an insulating substrate which has a rectangular shape having four corners and which has a central portion having a primary surface and a rectangular peripheral portion having a secondary surface surrounding said primary surface; and
    a plurality of electrode leads deposited on each side of said rectangular peripheral portion and including:
    first electrode leads coated on said secondary surface at positions remote from said four corners and each of which has a first predetermined width, and
    second electrode leads each of which is coated outside of but adjacent to each of said corners and each of which has a second width wider than said first predetermined width to enhance strength of solder connections between said second electrode leads and electrodes of a chip, wherein said second width is approximately 0.6 mm, while said first width is approximately 0.3 mm.

2. A chip carrier as claimed in claim 1, wherein said insulating substrate is made of a glass epoxy resin plate.

3. A chip carrier as claimed in claim 1, wherein said insulating substrate is made of a multilayer ceramic plate formed by a plurality of ceramic layers.

4. A chip carrier as claimed in claim 1, wherein said primary surface is offset from said secondary surface.

5. A chip carrier as claimed in claim 1, wherein maid primary surface is flush with said secondary surface.

6. A chip carrier as claimed in claim 1, wherein said second electrode leads are equal in number to four; each second electrode lead being located adjacent each of four corners.

7. A chip carrier as claimed in claim 1, wherein said second electrode leads are located adjacent both sides of each of said four corners with each corner interposed therebetween.

8. A chip carrier as claimed in claim 7, wherein said second electrode leads are equal in number to eight.

9. A chip carrier as claimed in claim 1, wherein each of said first electrode leads as well as said second electrode lead has a predetermined length, said length being approximately 0.4 mm, 10. In a chip carrier which is for use in supporting a semiconductor chip and which comprises:
    a leadless carrier portion made of an insulating substrate which has a rectangular shape having four corners and which has a central portion having a primary surface and a rectangular peripheral portion having a secondary surface surrounding said primary surface, and electrode leads deposited on said secondary surface at each side of said rectangular peripheral portion; said electrode leads being coated on said insulating substrate without extending beyond an outer edge of said peripheral portion and comprising first electrode leads positioned remote from said four corners and each of which has a first predetermined width, and second electrode leads each of which is coated outside of but adjacent to each of said corners and each of which has a second width wider than said first width to enhance strength of solder connections between said second electrode leads and electrodes of a chip, wherein
    said second width is approximately 0.6 mm, while said first width is approximately 0.3 mm.

11. A semiconductor device comprising:
    an insulating substrate which has a rectangular shape having four corners and which has a central portion having a primary surface and a rectangular peripheral portion having a secondary surface surrounding said primary surface;
    a semiconductor chip which is mounted on said primary surface and which has thereon a circuit selected from the group consisting of an IC circuit, an LSI circuit, and a VLSI circuit; and a plurality of chip electrodes;
    electrode leads coated on each side of said peripheral portion without extending beyond an outer edge of said peripheral portion and including:
    first electrode leads deposited on said secondary surface at positions remote from said four corners and each of which has a first predetermined width and
    second electrode leads each of which is deposited outside of but adjacent to each of said corners; and
    connection means for connecting said chip electrodes to said first and second electrode leads,
    each of said second electrode leads having a second width wider than said first width so as to enhance strength of solder connections between said electrode leads and said chip electrodes, wherein said second width is approximately 0.6 mm, while said first width is approximately 0.3 mm.

12. A semiconductor apparatus as claimed in claim 11, wherein said circuit board has a thickness which is not more than 0.6 mm.

13. A semiconductor apparatus comprising:

a circuit board which has a board surface and a plurality of board electrodes;

an insulating substrate which has a rectangular shape having four corners and which has a central portion having a primary surface and a rectangular peripheral portion having a secondary surface surrounding said primary surface;

a semiconductor chip which is mounted on said primary surface and which has thereon a circuit selected from the group consisting of an IC circuit, and LSI circuit, and a VLSI circuit, and a plurality of chip electrodes;

electrode leads coated on each side of said peripheral portion and including:

first electrode leads deposited on said secondary surface at positions remote from said four corners and each of which has a first predetermined width and second electrode leads each of which is deposited outside of but adjacent to each of said corners;

first connection means for connecting said chip electrodes to said first and said second electrode leads; and second connection means for connecting said board electrodes to each said first and said second electrode leads, each of said second electrode leads having a second width greater than said first width so as to enhance strength of solder connections between said electrode leads and said board electrodes, wherein said second width is approximately 0.6 mm, while said first width is approximately 0.3 mm.

* * * * *